United States Patent [19]

McKenzie, Jr.

[11] 4,420,877
[45] Dec. 20, 1983

[54] SELF-MASKING SOCKET PIN CARRIER FOR PRINTED CIRCUIT BOARDS

[76] Inventor: Joseph A. McKenzie, Jr., 6330 Laura La., Pleasanton, Calif. 94566

[21] Appl. No.: 245,442

[22] Filed: Mar. 19, 1981

[51] Int. Cl.³ .............................................. B23P 19/00
[52] U.S. Cl. ....................................... 29/739; 29/843; 228/47; 228/58; 228/180 R; 339/17 C; 414/736
[58] Field of Search ................... 227/53; 339/276 SF, 339/17 C, 17 R; 29/842-845, 739, 740, 741; 228/47, 58, 180 R, 180 A, 212; 414/736

[56] References Cited

U.S. PATENT DOCUMENTS

| | | | |
|---|---|---|---|
| 3,621,445 | 11/1971 | Horecky | 339/17 C |
| 3,737,998 | 6/1973 | Byrd | 29/845 |
| 3,807,047 | 4/1974 | Bennett et al. | 29/845 |
| 4,099,615 | 7/1978 | Lemke et al. | 339/276 SF X |
| 4,236,776 | 12/1980 | Wellington | 339/17 R |

*Primary Examiner*—Francis S. Husar
*Assistant Examiner*—Carl J. Arbes
*Attorney, Agent, or Firm*—C. Michael Zimmerman

[57] ABSTRACT

A carrier supports electrically conductive hollow pins for insertion and soldering in terminal lead-holes passing through the non-conductive substrate of a printed circuit board and formation of an electrical socket in the non-conductive substrate. Each hollow pin forms an electrical receptacle contact of the socket having an exposed opening for receiving a mating contact pin terminal of an electrical plug. The carrier includes a support structure for receiving and releasably supporting a plurality of the hollow pins in a selected pattern for inserting in a like plurality of terminal lead-holes arranged in the selected pattern. The carrier also includes a barrier structure joined to the support structure relative to the openings of the supported hollow pins and to the printed circuit board substrate to prevent solder applied to the hollow pins to secure them in the lead-holes from entering the openings. Preferably, the support structure and barrier structure are formed as a unitary molded plastic body, which bears a visually perceptible code indicia signifying the number of hollow socket contact pins that the carrier holds.

20 Claims, 7 Drawing Figures

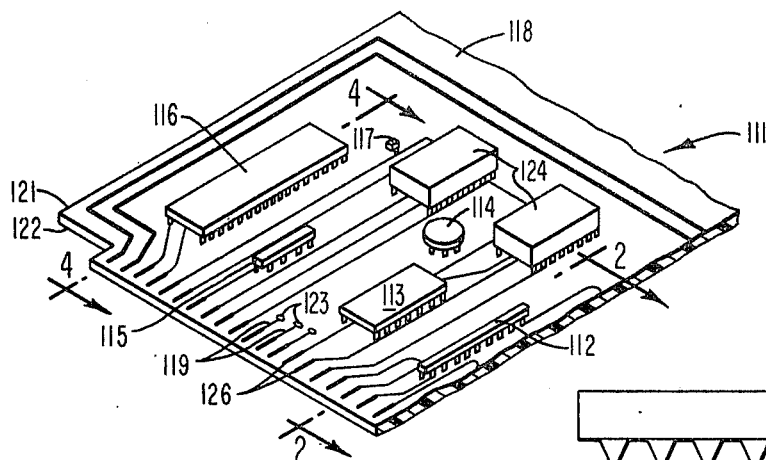
FIG_1
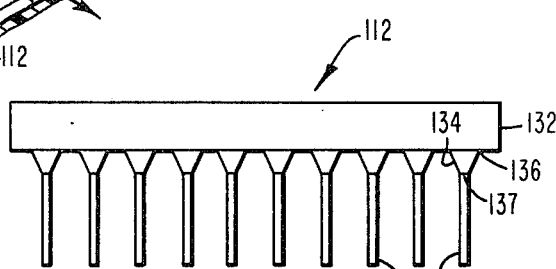
FIG_2
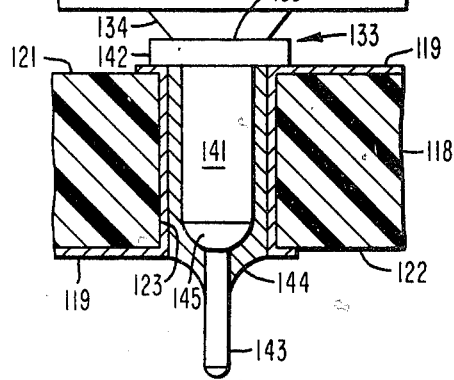
FIG_3
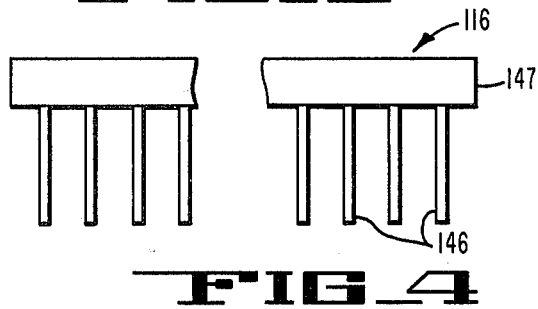
FIG_4
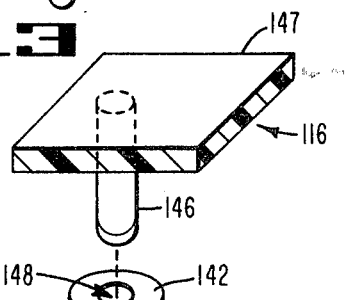
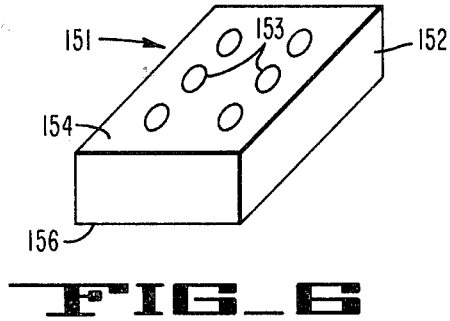
FIG_6
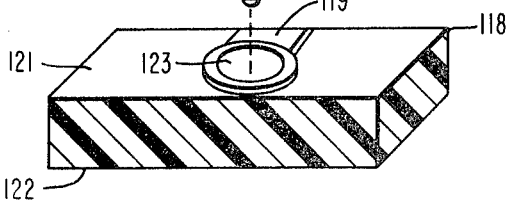
FIG_5
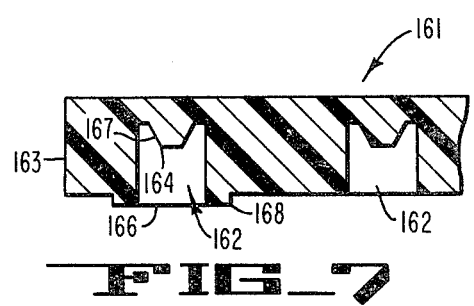
FIG_7

SELF-MASKING SOCKET PIN CARRIER FOR PRINTED CIRCUIT BOARDS

The present invention relates to tools for and methods of fabricating circuits on printed circuit boards. More particularly, however, it relates to a carrier for supporting electrically conductive receptacle contact bodies in the non-conductive substrate of a printed circuit board assembly to form an electrical socket in the substrate during the fabrication of the printed circuit board assembly and to a method of fabricating electrical sockets in such substrates.

Printed circuit boards provide the physical and electrical substrates connecting various electronic components together. Sockets for providing a severable electrical connection, for example, between different printed circuits or between a printed circuit and electronic components, are used extensively in printed circuit board assemblies. One type of socket in common use is in the form of a discrete electronic component including a plurality of electrically conductive receptacle contact bodies embedded in a body of electrically insulating material, with each receptacle contact body defining an exposed opening for receiving a mating contact pin terminal of an electrical plug. Such sockets are mounted on printed circuit boards in the same manner as any other discrete electronic component, such as an integrated circuit chip.

Another type of commonly used socket is formed directly in the printed circuit board substrate itself during the soldering of the electronic components on the printed board. In the fabrication of this socket type, electrically conductive hollow pins, defining openings for receiving mating contact pin terminal of an electrical plug, serve as the receptacle contacts of the socket. The hollow pins are held by a stamped metal pin carrier having flat pins inserted into the hollow pin openings to hold the hollow pins as they are inserted and soldered in terminal lead-holes formed in the non-conductive substrate of the printed circuit board assembly. Solder is flowed into the lead-holes around the hollow socket contact pins to capture them within the lead-holes. Following the socket pin capture, the carrier is withdrawn, leaving the hollow socket contact pins behind to form the desired electrical socket within the non-conductive printed circuit board substrate.

Electrical sockets formed within the substrate of a printed circuit board assembly offer several advantages over the discrete component electrical sockets. For example, forming the socket in the substrate of the printed circuit board assembly eliminates the need of a separate body of electrically insulating material for the socket. This results in a manufacturing cost saving because the need of the separate manufacture of sockets is obviated. Furthermore, electrical sockets formed in the substrate of the printed circuit board assembly conserve space that would otherwise be occupied by separate electrically insulating bodies of the discrete socket components. In high density electronic component packaging, space is very valuable.

While the use of the stamped metal pin carriers to form electrical sockets in the substrate of a printed circuit board assembly offers several advantages over the use of discrete component sockets, stamped metal pin carriers are characterized by several disadvantages preventing the full realization of such advantages. Stamped metal pin carriers are fabricated from thin, flat metal sheets that are stamped and folded into a desired configuration. They include flat web members from which flat carrier pins extend for holding the hollow socket contact pins in the terminal lead-holes of a printed circuit board while the board is subjected to a soldering process (typically, the widely used wave soldering process) to physically and electrically secure electronic components on the printed circuit board. In the wave soldering process, the lower side of the printed circuit board (i.e., the side opposite that on which the electronic components are located) is subjected to a traveling wave of molten solder. Occasionally, molten solder will reach the upper side of the printed circuit board during the soldering process and enter the hollow socket contact pins through the space that exists between the flat straight carrier pins and the surrounding walls of hollow socket contact pins defining the openings for receiving mating contact pins terminals of an electrical plug. Upon soldifying, the solder forms and obstruction that renders the electrical socket and associated printed circuit board assembly defective and useless. While such defective printed circuit board assemblies can be salvaged or repaired, it requires expensive manual labor.

Another disadvantage characterizing the stamped metal pin carriers is their fragility. Flexing the straight carrier pins only a few times usually results in the breaking of the pins from the supporting web of the carrier. Between the manufacture of the pin carrier and use in fabricating an electrical socket, the pin carrier is handled many times. Such handling often results in destructive bending or repeated flexing of the carrier pins. Occasionally, abusive handling does not break the carrier pins, but does severly weaken their connection at the supporting web of the carrier. Such weakened carrier pins often break and form obstructions within the hollow socket contact pins upon insertion or withdrawal of the pin carrier into or from the hollow socket contact pins. Usually, the hollow pins are thrown away, if the carrier pins break therein before the hollow pins are soldered in the printed circuit board. This is an undesirable material waste and expense. If such breaking is not detected or does not occur until after the soldering of the hollow pins in the printed circuit boards, expensive manual labor is required to salvage or repair the resulting defective printed circuit board assembly.

The present invention is a self-masking socket contact carrier for and method of fabricating electrical printed circuit board sockets, which prevents the formation of obstructions within receptacle contact bodies used to form the electrical contacts of sockets. Generally, the contact carrier includes a support structure receiving and releasably supporting at least one receptacle contact body. Each supported receptacle contact body defines an opening for receiving an electrical pin contact terminal of an electrical plug and is releasably supported by the support structure of the contact carrier while it is inserted and soldered in terminal lead-hole formed in the substrate of a printed circuit board. The receptacle contact is inserted in the lead-hole so that its opening remains exposed upon fabrication of the socket to receive pin contact terminals of electrical plugs. To prevent molten solder applied to secure the receptacle contact body within the lead-hole from entering the opening defined by such body, the contact carrier includes a barrier structure joined to the support structure relative to the opening and to the printed circuit board substrate to prevent the applied solder from entering the opening. Ordinarily, electrical printed circuit board sockets include a plurality of receptacle contact bodies arranged in a selected contact pattern. To fabricate such multiple contact sockets, the contact carrier includes a support structure and barrier structure for receiving and supporting a comparable plurality of receptacle contact bodies arranged in a pattern corresponding to the selected contact pattern of the socket being fabricated. This contact carrier construction prevents the inadvertent flow of molten solder (or other undesirable debris) into the electrical contact receptacle, such as can occur during the soldering of electronic components on printed circuit boards.

A sturdy self-masking socket contact carrier that facilitates the fabrication of sockets on printed circuit boards is achieved in accordance with the present invention by forming the support structure and associated barrier structure as a unitary body of plastic material selected to have resiliency. The use of plastic material in the construction of the contact carrier enables relatively inexpensive injection molding techniques to be used in the manufacture of the carrier. Furthermore, the resilient characteristic of the selected plastic material results in the carrier being less susceptible to damage from handling, such as caused by bending or flexing the pins of the prior art stamped metal pin carriers.

A wide variety of electrical sockets are used in printed circuits. Generally, they have their receptacle contact bodies arranged in a circular or a straight line contact pattern, with the number of contacts included in the pattern varying over a large range. However, many manufacturers of electronic circuits using printed circuit boards employ printed circuit board socket designs of standard receptacle contact size, spacing and number. For example, many electronic components that are made to plug into a printed circuit board socket have an even number of pin contacts. To facilitate the selection of the properly sized contact carrier during the fabrication of printed circuit board sockets and the inventory control of contact carrier stock, the contact carrier of the present invention is provided with a visually perceptible code indicia that signifies the number of socket contact bodies the carrier is capable of holding. While various forms of visually perceptible indicia may be used, color is preferred for use on the contact carrier of the present invention so that advantage may be taken of the well-known color coded numbering system established by the Electronic Industries Association for use in numerically identifying electronic components. In that system, the following colors are widely recognized by those in the electronic industry to represent the indicated numbers:

| Black | 0 | Green | 5 |
|---|---|---|---|
| Brown | 1 | Blue | 6 |
| Red | 2 | Violet | 7 |
| Orange | 3 | Grey | 8 |
| Yellow | 4 | White | 9 |

In a preferred contact carrier embodiment of the present invention, the carrier is made of plastic material with color pigmentation added according to the above table to signify the least significant digit of the number of contacts the carrier is capable of holding. It is only necessary to signify the least significant digit of the contact number because one accustomed to using contact carriers to fabricate electrical printed circuit board sockets can determine the other most significant digit of the contact number by inspecting the size of the commonly used contact carrier.

In fabricating printed circuit board assemblies in accordance with the present invention, the number of electrically conductive receptacle contact bodies required to fabricate the desired electrical printed circuit board socket (or sockets, if more than one socket is to be formed at one time on a printed circuit board) are loaded onto a contact carrier of the type described hereinbefore as characterizing the present invention, with the receptacle contact bodies being held by the carrier in a pattern corresponding to the contact pattern desired for the socket. Following the loading of the receptacle contact bodies onto the contact carrier, the loaded receptacle contact bodies are simultaneously inserted into terminal lead-holes formed in the printed circuit board in a pattern corresponding to the contact pattern desired for the printed circuit board socket. The loaded receptacle contact bodies are inserted into the lead-holes from a side of the printed circuit board so that the barrier structure of the contact carrier forms a barrier between the openings of the receptacle contact bodies and the side of the printed circuit board that prevents solder entering the openings from that side. After the receptacle contact bodies are thusly inserted into the lead-holes, the printed circuit board assembly is subjected to a soldering process that flows molten solder around the receptacle contact bodies located within the lead-holes to thereby physically and electrically secure them within the printed circuit board. Following completion of the soldering process and solidification of the molten solder, the contact carrier can be withdrawn from the secured receptacle contact bodies. The fabrication of electrical printed circuit board sockets in accordance with the present invention facilitates the construction of sockets with minimum waste and expense while retaining all of the advantages discussed above with reference to the formation of electrical sockets within the substrates of printed circuit boards by the use of stamped metal pin carriers.

The foregoing and other features and advantages of the self-masking socket contact carrier and method of socket fabrication of the present invention will become more apparent upon consideration of the following more detailed description of the preferred embodiments of the invention and appended claims taken together with the accompanying drawings in which:

FIG. 1 is a top perspective view of a portion of a printed circuit board assembly having various embodiments of the self-masking socket contact carrier of the present invention installed thereon;

FIG. 2 is a side elevation view of one pin-type embodiment of the self-masking socket contact carrier taken on the plane indicated by lines 2—2 in FIG. 1;

FIG. 3 is a side elevation view illustrating the installation of the self-masking socket contact carrier embodiment illustrated in FIG. 2 and the socket contact pin in a printed circuit board assembly;

FIG. 4 is a side elevation view of another pin-type embodiment of the self-masking socket contact carrier taken on the plane indicated by lines 4—4 in FIG. 1;

FIG. 5 is an exploded top perspective view of a portion of a printed circuit board assembly illustrating the relationship of the self-masking socket contact carrier embodiment illustrated in FIG. 4, socket contact pin and terminal lead-hole formed in the substrate of the printed circuit board for receiving the socket pin.

FIG. 6 is a top perspective view of a hole-type embodiment of the self-masking socket contact carrier of the present invention; and FIG. 7 is a side elevation cross-sectional view of a portion of a recess-type embodiment of the self-masking socket contact carrier of the present invention.

Similar parts of the articles illustrated throughout the several figures are represented by like reference numerals.

Referring to FIG. 1, a portion of a printed circuit board assembly, generally, indicated by reference numeral 111, is illustrated as having a plurality of self-masking socket pin carriers 112–117 installed thereon. Printed circuit board assembly 111 includes a rigid sheet 118 of electrically non-conductive material, such as a resin impregnated fiberglass, having patterns of electrically conductive leads 119 on one or both of its upper and lower side surfaces 121 and 122. As illustrated, a plurality of terminal lead-holes 123 extend through the rigid sheet 118, providing receptacles for pin terminals of electronic components (two of which are schematically represented and denoted by the reference numeral 124) making up a desired electrical circuit. The rigid sheet 118 of electrically non-conductive material serves to physically support the electronic components and to provide a substrate upon which the electrically conductive leads 119 are formed to provide the necessary electrical lead connections between the various supported components, electrical sockets providing severable electrical connections for electronic components, and printed electrical contacts to complete the desired electrical circuit.

The printed circuit board assembly 111 with which the self-masking socket contact carriers 112–117 are intended to be used, typically is fabricated by printing, etching, etc., conductive strips or leads 119 and contacts 126 in a desired pattern onto one or both side surfaces 121 and 122 of the rigid sheet 118 of electrically non-conductive material. FIG. 3 shows conductive strips printed on both sides surfaces 121 and 122 of the rigid sheet 118. In addition, the walls of lead-holes 123 passing through the sheet 118 may have conductive material deposited thereon during the "printing" process, such as illustrated in FIG. 3.

After printing the desired conductive lead pattern on the rigid sheet 118, the requisite electronic components are mounted at the appropriate locations on the sheet 118, with their pin terminals extending into terminal lead-holes 123 formed in the sheet in a hole pattern matching the pin pattern of the component pin terminal arrangement. The printed sheet 118 with the electronic components mounted thereon is then subjected to a soldering process to secure all of the component terminals, both physically and electrically, within the lead-holes 123. The result is that the electronic components are structurally secured to the printed sheet in good electrical contact with the printed circuit patterns thereon to form the printed circuit board assembly 111.

Usually, a mass soldering process is used to solder the electronic components to the printed circuit board. The wave soldering process is a common mass soldering process that is used. In that process, the lower surface 122 of the printed circuit board or sheet 118 is subjected to a traveling wave of molten solder. As the traveling wave of molten solder flows over the lower surface 122, solder is drawn by capillary action into the lead-holes 123 to fill the space between the electronic component terminals extending into the lead-holes and the surrounding walls of the sheet 118 defining the lead-holes. The wave soldering process, or other commonly used soldering processes, such as hand soldering, dip soldering or laser, vaper-phase or induction-heating reflow soldering, may be used to physically and electrically secure electronic components to printed circuit boards and to fabricate electrical sockets in such boards in accordance with the present invention.

Many printed circuit board assemblies are fabricated to include unoccupied terminal lead-holes so that electronic components can be mounted to the printed circuit board assemblies after the soldering process. In such fabrications, lead-holes unoccupied at the time of soldering are masked to prevent entry of solder that forms obstructions capable of blocking the subsequent insertion therein of component pin terminals. A particularly advantageous lead-hole masking technique is described in my copending U.S. Pat. application, Ser. No. 163,303, filed June 26, 1980, entitled "Component Mask for Printed Circuit Boards and Method of Use Thereof". In accordance with the masking technique described in my aforesaid copending United States patent application, pins extending from a supporting block are inserted into the lead-holes in the printed circuit board substrate that are to remain unoccupied. The pins are configured and dimensioned to prevent the formation of solder obstructions in the unoccupied lead-holes while permitting solder to enter the lead-holes and wet the walls thereof as the printed circuit board is subjected to a soldering process. As will become apparent from the detailed descriptions of the self-masking socket contact carrier embodiments of the present invention, certain of the socket contact carriers can be used also as a component lead-hole mask.

In addition, printed circuit board assemblies often include one or more electrical sockets for severable electrical connection of the electrical circuit of the printed circuit board assembly to other electronic components. In accordance with the present invention, such electrical sockets are formed directly in the electrically non-conductive sheet 118 of the printed circuit board assembly 111 during the fabrication of the assembly by the use of self-masking socket contact carriers, such as denoted in FIG. 1 by reference numerals 112 through 117. The details of two embodiments of the self-masking socket contact carrier of the present invention shown as being used in the fabrication of printed circuit board assembly 111 of FIG. 1 are illustrated in the drawings, one embodiment by FIGS. 2 and 3 and the other by FIGS. 4 and 5. In addition, two other embodiments of a self-masking socket contact carrier of the present invention that can be used in such fabrications are illustrated by FIGS. 6 and 7. As can be seen by reference to FIG. 1, however, electrical printed circuit board sockets have various electrical contact patterns and numbers. For example, contact patterns can be circular (as indicated by the self-masking socket contact carrier 114), a single linear row (as indicated by the contact carriers 112 and 115), multiple linear rows (as indicated by the contact carrier 116), or any other contact pattern dictated by design need or choice. Furthermore, the electrical sockets can have any number of electrical contacts from, for example, one as indicated by the self-masking socket contact carrier 117 to a large plurality as indicated by the contact carrier 116. The particular number of electrical contacts included in a socket is dictated by need and choice of circuit design.

Referring now to FIGS. 2 and 3, the self-masking socket contact carrier 112 includes a plurality of pins 131 extending from a support block 132 for inserting into and supporting electrically conductive, open-end hollow pins 133 (FIG. 3) that form the electrical receptacle contacts in printed circuit board sockets. The contact support pins 131 of the carrier 112 are arranged in a pattern corresponding to that of the contacts of the printed circuit board socket that is to be fabricated. The carrier embodiment 112 illustrated in FIGS. 2 and 3 is used to fabricate a single row, multiple pin socket. As illustrated in FIGS. 2 and 3, each pin 131 of the carrier 112 is connected to the support block 132 by a truncated conically shaped body 134, having its large base end 136 joined to the support block 132 and its smaller truncated end 137 joined to the associated carrier pin 131. The truncated end 137 of the conically shaped body 134 has a cross-section matching that of the associated carrier pin 131, while the base end 136 of the body 134 has a larger corresponding cross-section. Each carrier pin 131 is configured and dimensioned to be snuggly received within the hollow pin 133, with the truncated end 137 of the connecting body 134 abutting the open end 138 of the hollow pin through which a contact pin terminal of a mating electrical plug is inserted.

FIG. 3 illustrates the manner in which the contact carrier 112 functions in the fabrication of printed circuit board sockets. More particularly, a hollow socket contact pin 133 is loaded onto each carrier support pin (not shown in FIG. 3) that extends from the associated conically shaped connecting body 134. The conically shaped connecting body is dimensioned to penetrate and plug the open end 138 of the hollow socket contact pin 133 through which the carrier pin is inserted. Plugging the open end 138 of the hollow socket contact pin 133 seals the interior of the hollow pin to form a barrier against intrusion of solder or other undesirable debris during fabrication of the printed circuit board assembly 111. Such solder or debris often forms obstructions preventing the insertion of electrical pin terminals into the hollow socket contact. The conical shape of the connecting body 134 also serves to center the hollow socket contact pin 133 within the lead-hole 123. It should be appreciated that the terminal base end 136 of the conically shaped body 134, or any other shaped transition body, need not be connected directly to the support block 132. Instead, a connecting member may extend between the base end 136 and support block 132 for fastening the transition body 134 to the support block. Furthermore, it should be appreciated also that the transition body 134 can be of shapes other than circular truncated cones, for example, cylindrical, and need not penetrate the open end 138 of the hollow socket contact pin 133 loaded on the associated carrier pin 131.

Hollow pins 133 commonly used to fabricate electrical printed circuit board sockets are made of nickel plated brass and include a tubular segment 141 extending from a flange 142 formed about the open end 138 of the hollow pin. A solid cylindrical segment 143 of a diameter smaller than the tubular segment 141 extends from the end of the tubular segment distal the flange 142. A spring contact mechanism is located internally of the tubular segment 141 to facilitate making good electrical contact with the pin terminals of electrical plugs that are inserted into the tubular segment. Such hollow pins are used with the above-described stamped metal pin carriers to fabricate printed circuit board sockets. The two different diameter segments 141 and 143 of the hollow pins 133 permit the pins to be inserted in different sized terminal lead-holes. In smaller lead-holes, the solid cylindrical segment 143 is inserted in the lead-hole, with the shoulder 145 formed at the junction of the two segments seated against the printed circuit board and the tubular segment 141 extending above board. In larger lead-holes, the larger diameter tubular segment 141 is inserted in the lead-hole with the flange 142 seated against the printed circuit board. The flange 142 or shoulder 145 serve to prevent the hollow socket contact pin 133 from falling through the lead-hole should it become dislodged from the contact carrier 112. However, the flange 142 and shoulder 145 can be omitted from the hollow socket contact pins, if the risk of dislodging from the contact carrier is acceptable. Also, other means of retaining the hollow socket contact pin within the lead-hole can be used in place of the omitted flange 142 or shoulder 145 while the socket is formed within the body of the printed circuit board.

In a preferred embodiment of the present invention, further advantage is taken of the ready availability of the illustrated hollow socket contact pins 133 and the presence of the flange 142 and shoulder 145 in the pins. More specifically, the hollow socket contact pins 133 loaded on the contact carrier 112 are simultaneously inserted into terminal lead-holes 123 arranged in a pattern corresponding to that desired for the printed circuit board socket. Preferably, each hollow socket contact pin 133 is dimensioned so that upon insertion within an associated lead-hole 123 the tubular segment 141 of the hollow pin is received within the lead-hole with clearance for solder 144 that physically and electrically secures the hollow socket pin within the lead-hole. In addition, the carrier pins 131 of the contact carrier 112 are preferably dimensioned to be gripped and held by the spring contact mechanisms located internally of the tubular segments 141. The hollow socket contact pin 133 is inserted within an associated lead-hole 123 so that its flange 142 is supported by the printed sheet 118 about the circumference of the lead-hole. In the embodiment of FIG. 3, the flange 142 rests against the conductive material forming the printed conductive leads 119 surrounding the lead-hole 123. However, at other circuit locations of the printed circuit board assembly 111, the flange 142 may rest directly against the non-conductive sheet 118 of the assembly because conductive material is not printed on the sheet at such locations. The flange 142 serves to space the contact carrier 112 away from the surface of the printed circuit board assembly 111 on which the carrier is mounted. This ensures that the contact carrier 112 will not entrap flux residue or other debris resulting from the fabrication of the printed circuit board assembly 111. It also enables the surface of the printed circuit board assembly on which the contact carrier 112 is mounted to be unobstructively flushed with a cleaning solution.

If the terminal lead-holes 123 in which the socket contacts are to be formed are designed to receive only the smaller solid cylindrical segment 143 for securing the hollow socket contact pins 133 in the printed sheet 118, the shoulder 145 of each hollow pin is utilized to serve the purposes described above for the flange 142. In this regard, the shoulder 145 of each hollow socket contact pin is seated against the printed sheet 118 about the circumference of the lead-hole into which the hollow pin is inserted with the tubular segment 141 extending above the surface of the printed circuit board and spacing the contact carrier 112 away from that surface.

Making use of the flange 142 (or shoulder 145) of the common hollow socket contact pin 133 in the above-described manner facilitates the efficient manufacture of electrical sockets embedded in non-conductive substrates or sheets 118 of printed circuit board assemblies 111. While the solid cylindrical segment 143 of the hollow socket contact pin 133 may extend undesirably from the printed circuit board assembly 111, for example, as shown in FIG. 3, the undesirably extending portion of such segments 143 can be removed conveniently by shearing, preferably, after the socket contact pins 133 are soldered in place. However, as discussed hereinbefore, the hollow socket contact pins 133 can be specially made to eliminate the solid cylindrical segment 143 and/or flange 142, if desired.

Typically, terminal lead-holes and socket contacts are circular in cross-section, although such items of rectangular cross-section are sometimes used. A common circular lead-hole has a diameter of about 0.03". For straight hollow socket contact pins designed for use with lead-holes of that size, the pins 131 of the contact carrier 112 are made straight and circular and have a length of about 0.1" and a diameter of about 0.021". The conically shaped body 134 connecting each carrier pin 131 to the support block 132 is a circular conic section aligned with its associated carrier pin and has a truncated end 137 of a diameter equal to that of the carrier pin 131. The conically shaped body 134 extends from its truncated end 137 for a length of about 0.025" and terminates at its larger circular base end 136 joined to the support block 132, which end has a diameter of about 0.05". A rectangular support block 132, having a thickness of about 0.05", is employed to support the carrier pins 131 of the contact carrier 112. As described hereinbefore, the contact carrier 112 supports a single row of pins 131 arranged in a straight line. A common multiple pin electronic component connector with such a pin terminal pattern has its pin terminals on 0.1" centers along the row. However, multiple pin connectors having a plurality of generally parallel rows of pin terminals, such as might be inserted in the sockets formed at the locations of the contact carriers 113 and 116 illustrated in FIG. 1, are designed to have various spacings between rows, row-to-row pin centers 0.3"0.4" and 0.6" being typical.

One particularly salient feature of the present invention is the preferred construction of the self-masking socket pin carrier as a unitary body of plastic material selected to have some resiliency. In that construction, the support block 132, socket contact supporting pins 131, and associated solder barrier bodies 134 are molded together to form a unitary body. Such construction provides sturdiness to the contact carrier and facilitates color coding the carrier to signify the number of contact support pins, hence, hollow socket pins held by the contact carrier. Nylon is a suitable plastic material for fabricating the contact carrier by, for example, injection molding. If desired, reinforcing and friction reducing ingredients can be combined with the nylon to strengthen and facilitate use of the molded pin carrier.

Referring now to FIGS. 4 and 5, another embodiment of the self-masking socket contact carrier, indicated by reference numeral 116, is illustrated in detail. This embodiment differs from the contact carrier 112 illustrated in FIGS. 2 and 3 by having pins 146 that are joined to a support block 147 without a larger connecting or transition body (such as the conically shaped body 134 of the contact carrier 112 shown in FIG. 2) interposed in line between the support block 147 and pins 146. Instead, the contact support pins 146 are joined directly to the support block 147, with the regions of the support block at the junctions of the pins and block forming a transition body from the pins 146 to the block 147. The body of the support block also rests against the hollow socket contact pins 133 (see FIG. 5) to close the plug pin terminal receiving opening 148 and form the barrier that prevents solder entering the hollow pins 133 from the adjacent printed circuit board sheet 118 during the soldering of the hollow pins in the terminal lead-holes 123. This contact carrier 116 is intended to be used with hollow socket contact pins 133 having a flange 142 (or shoulder 145) of sufficient thickness to space the pin carrier 116 away from the surface of the printed circuit board so that entrapment of debris is avoided and flush cleaning of the electronic component side of the printed circuit board assembly is facilitated. However, the pin carrier 116 can be used with hollow socket contact pins that do not have a flange 142, or other functionally equivalent segment extending above the surface 121 of the printed sheet 118. If it is desired to establish a space between the contact carrier 116 and the surface 121 when fabricating electrical sockets with unflanged hollow socket contact pins, a spacing member is positioned between the support block 147 and the printed circuit board surface 121 before soldering the hollow socket contact pin 133 into the lead-hole 123. For example, the spacing member may be arranged to form a barrier at the opening 148 of each hollow socket contact pin 133 to prevent entry of solder into the hollow pin while spacing the support block 147 from the surface 121 of the printed circuit board substrate 118. Alternatively, pedestals may be formed on the contact carrier 116, for example, at its four corners on the same side from which the contact support pins 146 extend, for spacing the contact carrier from the surface 121 of the printed circuit board substrate. If pedestals or like spacing members not closing the openings 148 of the hollow pins are used to establish the space between the contact carrier 116 and the substrate surface 121, the dimensions of the contact support pins 146 are selected so that they securely hold the hollow pins when inserted therein, with the plug pin terminal receiving openings of the hollow pins abutting the support block 147 so that solder can not enter the hollow pins through such openings. In use, the spacing member of such contact carrier embodiments supports the contact carrier 116 above the substrate surface 121 and the contact support pins 146 of the contact carrier support the hollow socket contact pins with their openings abutting the support block 147 above the substrate surface by virtue of the holding force established upon the insertion of the contact support pins 146 into the hollow socket contact pins. It should be appreciated that a temporary spacing member separated from the contact carrier 116 can be inserted between the support block 147 and substrate surface 121 to space them apart in place of the aforementioned pedestals.

In the embodiment of the contact carrier 116 illustrated in FIGS. 4 and 5, each contact support pin 146 extends from the plane of the support block 147 a distance so that, when the contact carrier carries hollow socket contact pins 133 inserted in the lead-holes 123, a surface portion of the support block 147 surrounding each contact support pin 146 abuts against the flange 142 to seal the opening 148 of each hollow pin 133 and to the block support 147 spaced above the surface 121 of the sheet 118. In all other respects, the contact carrier 116 is structurally and functionally like the contact carrier 112.

FIG. 6 illustrates a contact carrier embodiment 151 in which a support block 152 has holes 153 extending through it for receiving and supporting hollow socket contact pins. The pattern of the holes 153 is selected to correspond to the pattern of receptacle contacts desired for the electrical socket to be fabricated in the substrate of a printed circuit board. In use, the hollow socket contact pins are inserted in the holes 153, with the plug pin terminal receiving openings of the hollow pins facing in the same direction as the upper surface 154 of the support block 52 and the opposite ends of the hollow pins extending towards the printed circuit board. The thickness dimension of the support block 152 is selected so that the hollow socket contact pins it supports have ends extending outside the support block below its lower surface 156. The extending ends of the hollow pins are inserted in terminal lead-holes formed in the substrate of a printed circuit board, with the lower surface 156 of the support block 152 adjacent the substrate. The configuration and dimension of the support block 152 in a plane perpendicular to the extending holes 153 are selected so that the body of the support block masks the area of the underlying substrate in which the electrical socket is to be formed and establishes a barrier between the underlying substrate and the openings of the hollow socket contact pins inserted in the holes 153 of the support block 152. This barrier prevents solder that reaches the surface of the underlying substrate masked by the support block 152 from reaching the openings of the supported hollow socket contact pins.

The holes 153 of the contact carrier 151 preferably are constructed to have configurations and dimensions to support the hollow socket contact pins securely at the wall of the support block 152 defining the holes, while enabling the supported hollow pins to be inserted and withdrawn from the support block through its lower surface 156. This facilitates removal of the contact carrier 151 after the supported hollow pins have been soldered within the printed circuit board substrate. Such secure support may be achieved, for example, by configuring and dimensioning the holes 153 so that the defining walls of the support block 152 grip the hollow pins or so that an auxilliary retaining spring member can be inserted between the hollow pins and the walls to exert a spring force therebetween to secure the hollow pins within the holes. Preferably, unflanged hollow socket contact pins are used with the contact carrier embodiment 151 illustrated in FIG. 6. The use of such hollow pins enables the walls of the support block 152 defining the holes 153 to be contiguous with the hollow pins over the entire length of the holes, which provides a more secure gripping of the hollow pins by the support block walls.

Contact carrier 151 can be supported spaced from the underlying printed circuit board for flush cleaning purposes by spacing members arranged therewith in the same manner as described hereinbefore with reference to the contact carrier 116 illustrated in FIGS. 4 and 5. For example, pedestals (not shown) provided at the four corners of the lower surface 156 of the support block 152 conveniently establishes the desired space.

Another contact carrier embodiment 161 is illustrated in FIG. 7. In that embodiment, holes in the form of blind recesses 162 are provided in a support block 163 for receiving and supporting hollow socket contact pins. The hollow pins are inserted in the blind recesses 162 with their respective plug pin terminal receiving openings in the recesses. Each blind recess has a blind end 164 and an open end 166 through which a hollow pin is inserted for support in the recess. The blind end 164 covers the opening of the hollow pin inserted in the recess 162 and forms a barrier against the intrusion of solder into the hollow pin from the printed circuit board substrate in which the supported hollow pin is soldered. To securely support the hollow pin within the blind recess 162, each recess has a configuration and dimension so that walls of the support block 163 defining the blind recess grip the hollow pins (or so that an auxilliary retaining spring member can be located between the hollow pin and the recess walls to exert a spring force therebetween) to secure the hollow pin within the blind recess.

Additional hollow pin holding force can be obtained, and centering of the hollow pins within the lead-holes facilitated by the provision of a pin member 167 located centrally at the blind end 164 to extend therefrom towards the open end 166. In the illustrated embodiment of the contact carrier 161, the pin member 167 has a truncated conical cross-section, with its small truncated end facing in the same direction as the open end 166 and its larger base end secured to the support block 163. The truncated end of the pin member 167 has a configuration and dimension so that it seats within and closes the pin terminal contact opening of the hollow pin inserted within the blind recess 162. This forms a barrier that prevents solder entering the hollow socket contact pin from the printed circuit board substrate in which the supported hollow pin is soldered, while also centering the hollow pin within blind recess 162.

A pedestal 168 is shown circumjacent the open end 166 of one of the blind recesses 162. This pedestal cooperates with other unshown pedestals to space the support block 163 away from the underlying printed circuit board substrate. As discussed hereinbefore, such spacing prevents entrapment of flux residue and other undesirable debris between the support block 163 and underlying printed circuit board assembly and also facilitates flush cleaning of the printed circuit board assembly during its fabrication.

Another particularly salient feature of the self-masking socket contact carrier of the present invention is the placement of a visually perceptible code indicia on the contact carrier thhat signifies the number of receptacle contact bodies the carrier is capable of supporting, hence, the number of contacts in the electrical socket fabricated with the use of the contact carrier. Only the least significant digit of the carrier contact number need be signified by the code indicia because the number of contacts in sockets customarily used in printed circuit board assemblies varies only over a limited range not exceeding ten's of contacts and one accustomed to using contact carriers to fabricate electrical printed circuit board sockets can determine the other most significant digit of the contact number by inspecting the size of the contact carriers. Of the various forms of visually perceptible indicia that may be used to code the contact number on the contact carrier, color is preferred because of the ease of perception and so that advantage may be taken of the well-known color code numbering system established by the Electronic Industries Association. The colors used to code the ten digits in the decimal numbering system are set forth hereinabove. In contact carrier embodiments made of plastic, the contact number color code indicia can be placed on the carrier by adding color pigmentation ingredients to the plastic material used to fabricate the contact carriers. For example, referring again to FIG. 1, contact carrier 112 bears a color of black to signify it includes ten contact support pins. Contact carrier 117 bears a color of brown to signify it includes one contact support pin. Contact carrier 114 bears a color of blue to signify it includes six contact support pins. However, all the contact carriers 113, 115 and 116 bear the same color, yellow, although they include different numbers of contact support pins. However, each carrier's contact number ends with a four as its least significant digit, viz., contact carrier 113 includes fourteen pins, contact carrier 115 includes four pins, and contact carrier 116 includes thirty-four pins. As can be appreciated by reference to FIG. 1, the different pin numbers of the identically colored contact carriers 113, 115 and 116 are separated by readily discernible one or more counts of ten pins. Consequently, the exact pin count can be determined with ease by observation of color and size of the contact carrier. Placing such visually perceptible indicia of the contact carriers enables the stock of contact carriers to be determined and monitored with ease without having to tediously count the receptacle contact support of each carrier. Also, the compelling need to keep contact carriers of different pin numbers separate because of the inability to visually determine the number of receptable contact supports on different uncoded contact carriers no longer exists.

While the printed circuit board socket fabrication tool and technique of the present invention has been described in connection with certain preferred embodiments, it will be appreciated by those skilled in the art that various changes and modifications can be made without departing from its spirit. Therefore, it is intended that the scope of the invention not be limited other than by the terms of the following claims.

I claim:

1. A tool for fabricating an electrical socket within a non-conductive substrate of a printed circuit board, said fabricated socket having at least one electrical receptacle contact body defining an opening for receiving an electrical contact pin terminal of an electrical plug, said receptacle contact body secured by solder within a terminal lead-hole formed in said substrate with its opening exposed to receive said contact pin terminal, said tool comprising:
   a support structure including a support block to which is secured a pin structure for receiving and releasably supporting each receptacle contact body for insertion and soldering in the lead-hole of the substrate so that the opening of said receptacle contact body of the fabricated electrical socket is exposed to receive the contact pin of the electrical plug; and
   a barrier structure defined by a transition body joined to the support block and pin structure for covering the opening of the receptacle contact body supported by said pin structure, said pin structure and transition body having configurations and dimensions enabling said pin structure to be inserted into said receptacle contact body through its opening and support same with said transition body closing said opening to prevent solder applied to said receptacle contact body to secure same within the lead-hole from entering said opening.

2. The tool according to claim 1 wherein the support block includes a side wall extending into said support block from a surface thereof and terminating at an end wall within said support block to define a blind recess having an open end opposite said end wall for receiving the receptacle contact body, and the pin structure is joined to the end wall spaced from the side wall to extend toward the open end, the end wall covering the opening of the receptacle contact body supported by the pin structure to form the transition body.

3. A tool for fabricating an electrical socket within a non-conductive substrate of a printed circuit board, said fabricated socket having at least one electrical receptacle contact body defining an opening for receiving an electrical contact pin terminal of an electrical plug, said receptacle contact body secured by solder within a terminal lead-hole formed in said substrate with its opening exposed to receive said contact pin terminal, said tool comprising:
   a support structure including a support block having walls defining a hole for receiving each receptacle contact body with said walls supporting same for insertion and soldering in the lead-hole of the substrate so that the opening of said receptacle contact body of the fabricated electrical socket is exposed to receive the contact pin of the electrical plug; and
   a barrier structure joined to the support structure relative to the opening of the receptacle contact body supported within the hole defined by the support block to prevent solder applied to said receptacle contact body to secure same within the lead-hole from entering said opening.

4. The tool according to claim 3 wherein the hole extends through the support block to define opposite open ends, said hole having a configuration and dimension to encircle the receptacle contact body in a contiguous gripping relationship, and said support block includes a body encircling and extending transversely outward from said hole to form the barrier structure.

5. The tool according to claim 3 wherein the hole defined by the support block is a blind recess having a closed end and an opposite open end, the walls of said support block defining said blind recess having configurations and dimensions enabling the receptacle contact body to be received within said blind recess with said closed end of said blind recess closing the opening of said receptacle contact body to form the barrier structure while the walls defining said blind recess support said receptacle contact body therein.

6. The tool according to any one of claims 2 through 5 further comprising a spacer structure located between the support block and the printed circuit board to space said support block from said printed circuit board when the receptacle contact body is supported by said support block within the lead-hole of said printed circuit board.

7. A tool for fabricating an electrical socket in a non-conductive substrate of a printed circuit board, said fabricated socket having receptacle contact bodies defining openings for receiving electrical contact pin terminals of an electrical plug, said receptacle contact bodies secured by solder within terminal lead-holes formed in said substrate with their openings exposed to said contact pin terminals, said tool comprising a support block;

a plurality of pins secured to said block; and a transition body joined to each pin, said pins and transition bodies having configurations and dimensions enabling each pin to fit into and hold a receptacle contact body for insertion into a terminal lead-hole with the transition body joined to said pin closing the opening of said receptacle contact body.

8. The tool according to claim 7 further comprising a hollow pin receptacle contact body mounted on each pin secured to the support block, said hollow pin of electrically conductive material defining a receptacle contact therein and the opening for receiving contact pin terminals, said hollow pin having a configuration and dimension enabling said pin secured to the support block to fit into and hold said hollow pin while enabling said hollow pin to fit into a terminal lead-hole with space for surrounding solder.

9. The tool according to claim 8 wherein each hollow pin has a surrounding flange along its length, said flange of a configuration and dimension to rest on the substrate of the printed circuit board around the lead-hole and space the support block from the printed circuit board when said hollow pin is placed on the pin supported by said support block and within said lead-hole.

10. The tool according to either claim 7 or claim 8 wherein each transition body has the shape of a truncated cone with a truncated end joined to the pin and a base end secured to the support block.

11. The tool according to claim 7 wherein the fabricated electrical socket has a plurality of spaced apart receptacle contact bodies in a selected contact pattern, and the plurality of pins are secured to the support block spaced apart and in a pattern corresponding to the spacing and selected pattern of said receptacle contact bodies.

12. The tool according to claim 7 wherein each transition body is formed by a region within the support block surrounding each pin.

13. The tool according to claim 7 wherein the support block, pins, and transition bodies form a unitary body of plastic.

14. A tool for fabricating an electrical socket within a non-conductive substrate of a printed circuit board, said fabricated socket having at least one electrical receptacle contact body defining an opening for receiving an electrical contact pin terminal of an electrical plug, said receptacle contact body secured by solder within a terminal lead-hole formed in said substrate with its opening exposed to receive said contact pin terminal, said tool comprising:

a block defined by integral first and second segments;

said first segment is defined by a support structure configured and dimensioned for receiving and releasably supporting each receptacle contact body for insertion and soldering in the lead-hole of the substrate so that the opening of said receptacle contact body of the fabricated electrical socket is exposed to receive the contact pin of the electrical plug; and said second segment is defined by a barrier structure joined to the support structure relative to the opening of the receptacle contact body supported by the support structure and configured and dimensioned to prevent solder applied to said receptacle contact body to secure same within the lead-hole formed in the substrate of the printed circuit board from entering said opening.

15. The tool according to any one of the claims 1, 3, 7, 8, 11 or 14 further comprising a visually perceptible code indicia placed on said tool signifying the number of receptacle contact bodies capable of being supported by said tool.

16. The tool according to claim 15 wherein the visually perceptible code indicia is a color selected from a plurality of colors representing the ten decimal digits, said color indicia placed on said tool to signify only the least significant digit of the number of receptacle contact bodies capable of being supported by said tool.

17. The tool according to claim 14 wherein the support structure includes a pin structure, the barrier structure includes a transition body joining each pin structure to the block, and said pin structure and transition body having configurations and dimensions enabling said pin structure to be inserted into said receptacle contact body through its opening and support same with said transition body closing said opening against instrusion by solder.

18. The tool according to claim 14 wherein the support structure includes a wall extending into the block from a side thereof to define a hole for receiving the receptacle contact body with said wall encircling said receptacle contact body in a contiguous gripping relationship that prevents passage of solder between said wall and encircled receptacle contact body.

19. The tool according to claim 18 wherein the hole extends through the block to define opposite open ends, and the barrier structure includes a wall encircling and extending transversely outward from the hole.

20. The tool according to claim 18 wherein the support structure includes a side wall extending into the block and terminating at an end wall within said block to define a blind hole having an open end opposite said end wall, the end wall forms the barrier structure, and the blind hole is of a configuration and dimension so that the end wall closes the opening of the receptacle contact body inserted in said blind hole.

* * * * *